(12) United States Patent
Sanchez Hernandez

(10) Patent No.: US 11,815,539 B2
(45) Date of Patent: Nov. 14, 2023

(54) MULTIPLE-BAND COMPACT, NEAR-FIELD-TO-FAR-FIELD AND DIRECT FAR-FIELD TEST RANGE

(71) Applicant: EMITE INGENIERIA S.L., Fuente Alamo de Murcia (ES)

(72) Inventor: David Agapito Sanchez Hernandez, Murcia (ES)

(73) Assignee: EMITE INGENIERIA S.L., Fuente Alamo de Murcia (ES)

( * ) Notice: Subject to any disclaimer, the term of this patent is extended or adjusted under 35 U.S.C. 154(b) by 312 days.

(21) Appl. No.: 17/283,448

(22) PCT Filed: Oct. 9, 2018

(86) PCT No.: PCT/ES2018/070655
§ 371 (c)(1),
(2) Date: Apr. 7, 2021

(87) PCT Pub. No.: WO2020/074752
PCT Pub. Date: Apr. 16, 2020

(65) Prior Publication Data
US 2021/0341528 A1 Nov. 4, 2021

(51) Int. Cl.
*G01R 29/10* (2006.01)
*H01Q 1/38* (2006.01)
(Continued)

(52) U.S. Cl.
CPC ............ *G01R 29/105* (2013.01); *H01Q 1/38* (2013.01); *H01Q 13/0208* (2013.01);
(Continued)

(58) Field of Classification Search
CPC combination set(s) only.
See application file for complete search history.

(56) References Cited

U.S. PATENT DOCUMENTS

| 3,302,205 A | 1/1967 | Johnson |
|---|---|---|
| 4,208,661 A | 6/1980 | Vokurka |

(Continued)

FOREIGN PATENT DOCUMENTS

| DE | 2603055 A1 | 8/1977 |
|---|---|---|
| JP | 2002228697 A | 8/2002 |

(Continued)

OTHER PUBLICATIONS

Christian Hunscher et al., Satellite Antenna Measurements. Antennas, 2007. INICA '07. 2nd International ITG Conference on, Jan. 3, 2007 (Jan. 3, 2007), pp. 25-32, XP031151076, ISBN: 978-3-00-021644-2.

(Continued)

*Primary Examiner* — Alvaro E Fortich
(74) *Attorney, Agent, or Firm* — Harness, Dickey & Pierce, P.L.C.

(57) ABSTRACT

The invention discloses a hybrid compact, near-field-to-far-field and direct-far-field test system in an anechoic chamber. It comprises a curved reflector with its primary feed antenna set situated on a lateral side and pointing towards it, a secondary feed antenna set pierced to the reflector or in front of it, and one or several sets of antennas or devices under test (AUT/DUT), and their 3D turntable tower placed at a quiet zone, for which roll, elevation and azimuth can change. In a receive process, the primary antenna set transmits several signals towards the reflector, which reflects these signals towards the quiet zone in the form of planar wavefronts. The secondary antenna set also transmits several signals, but directly towards the quiet zone in spherical wavefronts. The AUT/DUT receives all these signals simultaneously. Through reciprocity, a similar measurement process for transmission can be performed.

10 Claims, 4 Drawing Sheets

(51) Int. Cl.
*H01Q 13/02* (2006.01)
*H01Q 15/14* (2006.01)
*H01Q 21/24* (2006.01)
*H04B 7/0413* (2017.01)

(52) U.S. Cl.
CPC ............. *H01Q 15/14* (2013.01); *H01Q 21/24* (2013.01); *H04B 7/0413* (2013.01)

(56) References Cited

U.S. PATENT DOCUMENTS

| | | | |
|---|---|---|---|
| 4,742,359 A | 5/1988 | Ishino et al. | |
| 4,949,093 A | 8/1990 | Dhanjal | |
| 5,341,150 A | 8/1994 | Joy | |
| 5,670,965 A | 9/1997 | Tuovinen et al. | |
| 6,115,003 A | 9/2000 | Kozakoff | |
| 8,330,640 B2 | 12/2012 | Liu | |
| 2008/0129615 A1* | 6/2008 | Breit | H04W 56/00 343/703 |
| 2010/0039332 A1 | 2/2010 | Dybdal et al. | |
| 2016/0226709 A1* | 8/2016 | Chen | H04L 1/0026 |
| 2016/0254870 A1* | 9/2016 | O'Keeffe | H04B 17/14 455/67.14 |
| 2017/0115334 A1* | 4/2017 | Symes | G01M 7/022 |
| 2017/0223559 A1* | 8/2017 | Kong | H04B 7/0413 |

FOREIGN PATENT DOCUMENTS

| | | |
|---|---|---|
| WO | WO-8606550 A1 | 11/1986 |
| WO | WO-2007136964 A2 | 11/2007 |

OTHER PUBLICATIONS

Jose Luis Besada et al.: "Deployment of an all-in-one millimetre—wave anechoic chamber. Antennas and Propagation (EuCAP", 2013 7th European Conference on, Aug. 4, 2013 (Aug. 4, 2013), pp. 3144-3146, XP032430654, ISBN: 978-1-4673-2187-7.

International Search Report PCT/ISA/210 for International Application No. PCT/ES2018/070655 dated Jun. 26, 2019.

* cited by examiner

MULTIPLE-BAND COMPACT, NEAR-FIELD-TO-FAR-FIELD AND DIRECT FAR-FIELD TEST RANGE

FIELD OF INVENTION

This invention relates generally to antenna and device test systems, and more particularly, to a hybrid compact (CATR), near-field to far-field (NFTF) and direct far-field (DFF) test range simultaneously employing a near-field test range, direct far-field test range and a compact antenna test range.

BACKGROUND OF THE INVENTION

Over the air testing of wireless devices typically employ test systems similar to those used for measuring antennas. Three different methods exist for measuring the radiation pattern of an antenna set or devices within an anechoic chamber. The oldest approach is to illuminate the AUT or DUT with the electromagnetic wave coming from a distant line-of-sight source. The electromagnetic field expanding into space from a point source is spherical when in the vicinity of the source, known as near-field, but at large distances in terms of wavelengths from the illuminating antenna, the wavefront can be observed as essentially planar, with uniform amplitude and phase. The boundary distance at which this occurs is defined in the scientific literature as the far-field distance, and delimits the initial surface in space at which the far field region starts, which continues as we move away from the source. The antenna set under test (AUT) or devices under test (DUT) have to be placed on the far-field region of the transmit antenna so as to observe such uniform wavefront. When placed in the near-field, the AUT or DUT observe a spherical wavefront, and some near to far-field conversion formulas have to be used to obtained the far-field measured parameters. The near to far-field boundary distance from the source depends on the antenna set or devices under test maximum dimension D and the frequency of operation by, $$2D^2/\lambda \quad (1)$$

which is obtained by allowing a maximum phase non-uniformity of 22.5 degrees at the wavefront. $\lambda$ is the illuminating signal wavelength. When signals of different frequencies are transmitted, each one defines a different near to far-field distance, resulting in far-field distances for the entire illuminated test being defined by the highest frequency employed (lowest associated wavelength) for a given AUT or DUT of max dimension D. A careful observation of equation (1) above reveals that for high frequencies and large antennas an excessive separation of the AUT or DUT from the source can be required to locate them at the far-field. For example, a set of devices or antennas with D=25 cm will need to be separated 2.5 m from the feed source antenna set to be considered to be at the far-field when operating at 6 GHz. In consequence, the direct far-field approach is typically employed for low frequencies and relatively small antennas, while the direct near-field approach is used when far-field distances are larger than the available space or chamber dimension. Other antenna parameters evaluated with this approach and well-known to those skilled in the art are beamdwidths, axial ratios, front-to-back ratios, gain, directivity, correlation, capacity, diversity, spectral efficiency and radiation efficiency.

Those skilled in the art also know that antennas are passive elements, and that the gain and directional characteristics are reciprocal or equal regardless of whether the antenna is transmitting or receiving energy, and that the response of devices or antennas can be different for diverse temperatures and humidity values. Thus, a test of the AUT in a receiving mode yields results which are equally applicable to a transmitting mode. In consequence, the invention will here be described with some elements acting as transmitters while others act as receivers, but due to the reciprocity the same invention applies to the situation in which those elements that act as transmitters now act as receivers while the elements that are described acting as receivers now act as transmitters. In addition, the invention also adds a climatic enclosure to account for the effects of different temperature and humidity conditions over the AUT or DUT, made with air-like-parameters foams.

A second approach measures the field amplitude and phase distribution within the near-field of the AUT or DUT and mathematically transforms these measurements to obtain the far-field values. This approach, known as near-field-to-far-field (NFTF), requires a near-to-far-field transformation, a very accurate positioning of a probe and it is very time-consuming, limiting the angular range of the calculated patterns in practice. The advantage of the near-field approach is that it does not require a large separation between feed source antenna set and AUT or DUT and, consequently, it can be very useful when space limitations exist.

The third approach is to use a compact antenna test range (CATR), which rely on reflecting the signal transmitted by a feed source in a typically-curved reflector to generate a planar electromagnetic wave on the reflector aperture at the frequency of interest, that is, the wave characteristics of a far-field but at much shorter distances from the source than the direct far-field approach. Feed antennas for the CATR can have single or dual polarization, and can come in one or several units so as to allow the excitation of several signals. A CATR uses the collimated near-field closed to the aperture of a large offset typically-curved reflector (U.S. Pat. No. 3,302,205), lens (WO2007136964) or hologram (U.S. Pat. No. 5,670,965) as a test field. The reflector is typically fed by a source antenna placed at its focal point, or in a lateral side, which has the operation requisite to illuminate the curved reflector surface as accurately as possible, avoiding spillover or loss of energy when not correctly pointing at the reflector. The reflector feed source antenna transmits electromagnetic waves towards the reflector. The curved surface at the reflector creates a uniform wavefront at its aperture for each signal sent by each primary feed source antenna set element. Reflections from the reflector edges typically distort the desired uniform test fields illuminating the antenna or device under test, and distances slightly above that of the reflector aperture are typically employed to determine the uniformity of the wavefront and, consequently, a far-field region. Rolled-edges (U.S. Pat. Nos. 5,341,150, 8,330,640), serrated-edges (U.S. Pat. No. 6,115,003), a secondary offset subreflector (WO8606550, U.S. Pat. No. 4,208,661) to accurately map a feed pattern onto a main typically-curved reflector, quasi-compact antenna test ranges with larger separating distances that compact ranges but still within the near field of the aperture and smaller than direct far-field separations (US 20100039332) or the use of a helical antenna with coils at the CATR feed source (U.S. Pat. No. 4,742,359) are proposed techniques to reduce this distortion of the wavefront coming from the reflector edges. The CATR method requires a larger reflector than the AUT being tested and a very accurate reflector surface manufacturing, but considerably reduces required far-field distance respect to the direct far-field method, which makes its use for middle and high frequencies and relatively large antennas very useful.

Several test systems using one of the three methods can be found in the literature, but to date there is no invention that can use all three approaches in a simultaneous manner as all of them employ a single wavefront propagating towards the antenna under test, and consequently, using more than one system would cause the physical components of one approach interfere or block the wavefronts created by other approaches. A possible hybridization of the three test approaches would require a direct feed source antenna pointing at the antenna or device under test to be positioned in between the reflector and that antenna set or devices under test, with the capability to be removed from its position when the direct far-field feed source antenna is not in use. As a result, time and labour costs are introduced for setting up, aligning, and storing the direct far-field feed source antenna in such a setup. Also, facility resources are required for storage and transport of the direct far-field feed source antenna when not in use, and although the two test approaches (direct far-field and CATR) could be installed within one system, they could not be operated simultaneously since the direct far-field feed source antenna would clearly physically block the CATR wavefront coming from the reflector towards the quiet test zone where the AUT is located.

Moreover, the simultaneous use of the three methods has not been needed for measuring antennas or device properties, but with the progress of communications, particularly advanced cellular and wireless systems, the simultaneous use of several frequency carriers has been proposed. Within the fifth generation (5G or New Radio, NR) of mobile wireless communications, very different frequency ranges, low (FR1 or Sub-6 GHz) and high (FR2 or mmWave) have been proposed to be combined and used in a simultaneous manner, as well as in combination to existing fourth generation (known as Long Term Evolution or LTE) carriers, in order to be capable of achieving the very high throughputs being demanded between mobile communications base stations, known as gNodeBs, and user equipment, known as UE. Either real gNodeBs or UE units or emulators of gNodeBs and UE units are typically used for over the air testing. It would then be helpful to invent an over the air AUT or DUT test system that provides different simultaneous wavefronts for a variety of frequency bands (or wireless communications carriers) and test approaches over a quiet test zone so as to be capable of receiving and/or transmitting all these different frequency bands and approaches in a simultaneous manner. Since it is also desired that all combined approaches provide the wavefronts from the same physical angle of arrival to the AUT or DUT, a direct combination of two or all three approaches is not obvious to the skill person, although a few options have been proposed to try and achieve this useful simultaneous use of different frequency bands (low, high) or at least overcome some drawbacks of one test approach by certain inventive modifications. We can describe some of these attempts.

It seems possible to enable different bands simultaneously in a compact antenna test range by dividing the reflector into different sections and consider these auxiliary reflectors separately, as described in DE2603055. The excitation units have to be mechanically interlinked in such a way that their phase centres will in each case coincide at the focal point of the main reflector. Only two of the main reflectors will be fitted with the excitation system, and some frequency restrictions apply since subreflectors have a smaller size than the main reflector. The advantages, but also the drawbacks of the CATR approach are however inherent to DE2603055, which simply multiplies one approach by several units of reduced size.

In JP2002228697, almost no cross polarization at the test zone is achieved in a compact antenna test range by using a lens shape of which the cross section in the light axis direction is thicker in the center than the edge part is cut in half with a plane vertical to the light axis direction and surrounded by a wave absorbing material. No direct wave is however sent to the quiet test zone, and therefore a single wavefront is still use in JP2002228697.

The use of two reflectors has also been reported as a way to create a plane wave in a test zone with a reduced length in U.S. Pat. Nos. 4,949,093, 4,208,661 and WO8606550. A second controllable reflector is located parallel or opposite to the main reflector. In US494093, a pulse of electromagnetic energy is injected into the space between the reflectors, propagating toward one of the reflectors. After a number of re-reflections, the controllable reflector is rendered transmissive and a substantially planar wavefront is made available for application to the antenna under test. The solution is similar to a CATR, but without using precise typically-curved reflectors which are expensive to manufacture. In U.S. Pat. No. 4,208,661, the focal line of the first reflector is made non-parallel to the symmetry plane of the second reflector. In WO8606550 the two reflectors are specially shaped and arranged in an offset configuration. The improvements in U.S. Pat. Nos. 4,949,093, 4,208,661 and WO8606550 are however over a single wavefront, that of a CATR. Since reflectors for CATR systems have to be very accurately manufactured, with typical required accuracies of $1/100$ of the wavelength to be operated, using two reflectors has a clear impact on cost and complexity, and it requires a larger anechoic chamber than systems with a single reflector. There is no invention today proposing a way to combine all three approaches in a way that the wavefronts created by one approach are not physically block by the physical components of a different approach aiming at the same quiet test zone from the same direction.

DESCRIPTION OF INVENTION

Embodiments of the present invention provide a test system that is capable of creating uniform wavefronts from a compact antenna test range with a curved reflector while simultaneously being capable of sending and receiving additional wavefronts at a different set of frequency bands from a feed source antenna set located behind the reflector but with its aperture or apertures pierced at the reflector center or right in front of it. In this way the three over the air AUT or DUT test approaches, CATR, NFTF and DFF, can simultaneously be used in a single test system. The surface pierced at the reflector center when the DFF is placed behind the reflector has to be small, that is, equal or less to one fourth, in comparison to the total reflector surface, as an operation requisite. Embodiments of the present invention can provide for savings of facility and labour costs associated with the use of other approaches which alternate between a CATR, a NFTF and a DFF test mode, and cannot use them simultaneously. Embodiments of the present invention can be used in compact radar ranges with lateral feeds. Advantageously, embodiments of the present invention can be retrofitted to existing compact ranges, thereby enabling a multi-band multi-approach operation of the existing compact ranges, allowing simultaneous test of low, middle and high frequencies within the same anechoic chamber and test system. The system is embodied into an anechoic chamber, with absorbers in the internal sides of walls, ceiling, door and floor, as well as on top of any support structure located inside of the chamber and which can produce radiation not intended to contribute to the desired wavefronts.

The effect of the reflector on the radiation by the secondary source antenna set is greatly reduced by the use of a high-gain corrugated circular or rectangular horn antennas at the secondary source feed antenna set in the present invention, which can make use of a reduced circular or rectangular aperture and radiate the vast majority of the electromagnetic wave towards the quiet test zone. Moreover, since the main radiation can be produced in a circular or rectangular horn or printed array either at the edges of its aperture when using EH electromagnetic modes or at the center of its aperture when using HE electromagnetic modes, the aperture of the antenna elements used at the secondary source feed antenna set can also optionally make use of diverse metallic caps, which help reducing the pierced surface area at the reflector when the DFF system is placed behind the reflector depending on the electromagnetic mode used at the horn or printed array.

The first element included in the hybrid compact, near-field-to-far-field and direct far-field test range system (1) is an anechoic chamber (2) with a door (3), wheels (4) and absorbing material (5) covering its internal walls, floor, door and ceiling.

The second element included in the hybrid compact, near-field-to-far-field and direct far-field test range system (1) is a curved reflector (6) with rolled- or serrated-edges, its lateral-fed primary feed source antenna set (7) and its tower (8), which can make use of one or several single- or dual-polarized primary feed source antenna elements (9) of the waveguide horn or printed array type having a narrow radiation pattern pointing directly towards the reflector surface, an antenna set or devices under test AUT/DUT (10) with its 3D positioner (11) located at the quiet test zone (12), which is a volume around the AUT or DUT, in which the 3D positioner can rotate the AUT/DUT over its roll, elevation and azimuth axes. The second element provides a set of uniform wavefronts at different frequency bands within the quiet test zone (12). The quiet test zone can optionally accommodate a climatic chamber (23) so as to allow the testing of different figures of merit at different temperature and/or humidity conditions.

The third element included in the hybrid compact, near-field-to-far-field and direct far-field test range system (1) is a secondary feed source antenna set (13) and its support tower (14), which can make use of one or several single- or dual-polarized secondary feed source antenna elements (15), of the waveguide horn or printed array type having a narrow radiation pattern, which apertures are either pierced (16) to the reflector center when the DFF system is located behind the reflector or placed just in front of the reflector. In order to reduce the aperture size and sidelobe levels of the secondary feed source antenna elements, these can be corrugated circular/rectangular horns or printed arrays. The third element provides a set of either spherical when NFTF or uniform when DFF wavefronts at different frequency bands within the quiet test zone. Although there is no restriction to the number of antenna elements at either the primary or the secondary feed source antenna set, the larger the number of antenna elements in the feed antenna set, the more difficult to fulfil the primary set requirements of illuminating the reflector on all feed antennas or the secondary set requirement of piercing a relatively-small-surface hole at the curved reflector or to located relatively small elements in front of the reflector. Optionally, the apertures being pierced at the reflector center, when used, can also be capped (17) to reduce the surface removed from the reflector. Advantageously, the support structures of the primary feed source antenna set and of the secondary feed source antenna set can accommodate multiple configurations with different number of brackets for allowing several antenna elements with either single or dual polarization on each element. In this way multiple wavefronts corresponding to multiple frequency bands can be provided by the primary feed source antenna set, and, similarly, multiple wavefronts corresponding to multiple frequency bands can also be provided by the secondary feed source antenna set in a simultaneous manner over the quiet test zone.

The fourth element included in the hybrid compact, near-field-to-far-field and direct far-field test range system (1) is the set of cables, wires, combiners and switches, either electric (18), bringing power supply to all elements, radiofrequency (19), carrying switched or combined radiofrequency signals in and out of the chamber, Ethernet (20) for carrying communication protocol signals and data, and fiber-optic (21), capable of carrying control signals for the gNodeBs, AUT or DUT.

The fifth element included in the hybrid compact, near-field-to-far-field and direct far-field test range system (1) is the receive/transmit auxiliary analyzer equipment (22), which can be located inside or outside of the chamber, and that is capable of analyzing signals coming from/to the AUT or DUT and determine the AUT or DUT response, reception or transmission parameters.

The first procedure performed by the hybrid compact, near-field-to-far-field and direct far-field test range system (1) is to employ any of the above five elements independently or in a combination, so as to provide a particular set of wavefronts within the quiet test zone (11), each one coming from each of the antenna elements at the primary antenna set 1 or the secondary antenna set 2. This procedure allows to determine and evaluate the AUT or DUT response and interaction to those wavefronts in terms of wireless communications standardized parameters well-known to those skilled in the art, such as sensitivity, transmit power, beamforming efficiency, throughput, latency, among others, for technology schemes such as massive MIMO, multi-user MIMO (MU MIMO), dual-connectivity (EN DC), or carrier aggregation (CA), among others.

The second procedure performed by the hybrid compact, near-field-to-far-field and direct far-field test range system (1) is to allow the AUT or DUT to transmit a signal or signals from the quiet test zone (11) towards the reflector, and eventually towards the primary antenna set 1, and also towards the secondary antenna set 2, allowing the reception and analyses of these signals in a simultaneous manner. This procedure allows to determine and evaluate the AUT or DUT transmit characteristics in terms of wireless communications standardized parameters, such as total radiated output power, beamforming efficiency, throughput or latency, among others.

This invention can be useful in the field of over the air (OTA) antennas and devices testing.

BRIEF DESCRIPTION OF THE DRAWINGS

FIG. 1 shows a hybrid compact, near-field-to-far-field and direct far-field test range system (1) which comprises the following elements: an anechoic chamber (2) with a door (3), wheels (4), and absorbing material (5), a curved offset reflector (6), a lateral CATR primary feed source antenna set (7) and its CATR-primary-feed support tower (8), composed by three secondary feed source dual-polarized waveguide corrugated antenna horn or printed array elements (9) as an example which point towards the curved offset reflector surface, an antenna set or devices under test (AUT, DUT) (10) with its AUT/DUT tower and turntable support and positioning structure (11) and its optional climatic chamber (23), located at a quiet test zone (12) and within the climatic enclosure (23) and capable of providing roll, elevation and azimuth rotation. FIG. 1 also illustrates other elements of an exemplary hybrid compact, near-field-to-far-field and direct far-field test range like the direct far-field (DFF) and near-field-to-far-field (NFTF) secondary feed source antenna set (13), with its DFF/NFTF support tower (14) and with three circular corrugated antenna horn secondary elements (15) as an example, with their circular horn apertures pierced (16) at the center of the curved reflector (6) or in front of it with a discontinuous line, a set of electric cables (18) bringing power supply to all elements, a set of Radiofrequency (19), Ethernet (20) and Fiber Optic cables (21) connecting the near-field-to-far-field, direct far-field and CATR feed source antenna sets and the AUT/DUT tower to a signal analyser equipment (22) located outside of the chamber as an example. The discontinuous lines coming/reaching the primary and secondary feed source antenna sets and reaching/coming the quiet test zone represent the different wavefronts created. As it can be observed, these wavefronts can be created in one direction or its opposite (bi-directional) by reciprocity.

FIG. 2 shows an example of the cap laced at the circular aperture of the center antenna element at the secondary feed source antenna set, but only as an example as any aperture among the antenna elements in the secondary feed source antenna set can include a cap. The possibility of using printed array antenna elements for the secondary feed source antenna set or for the primary feed source antenna set is also illustrated in FIG. 2.

REALIZATION MODE OF THE INVENTION

Figure 1:
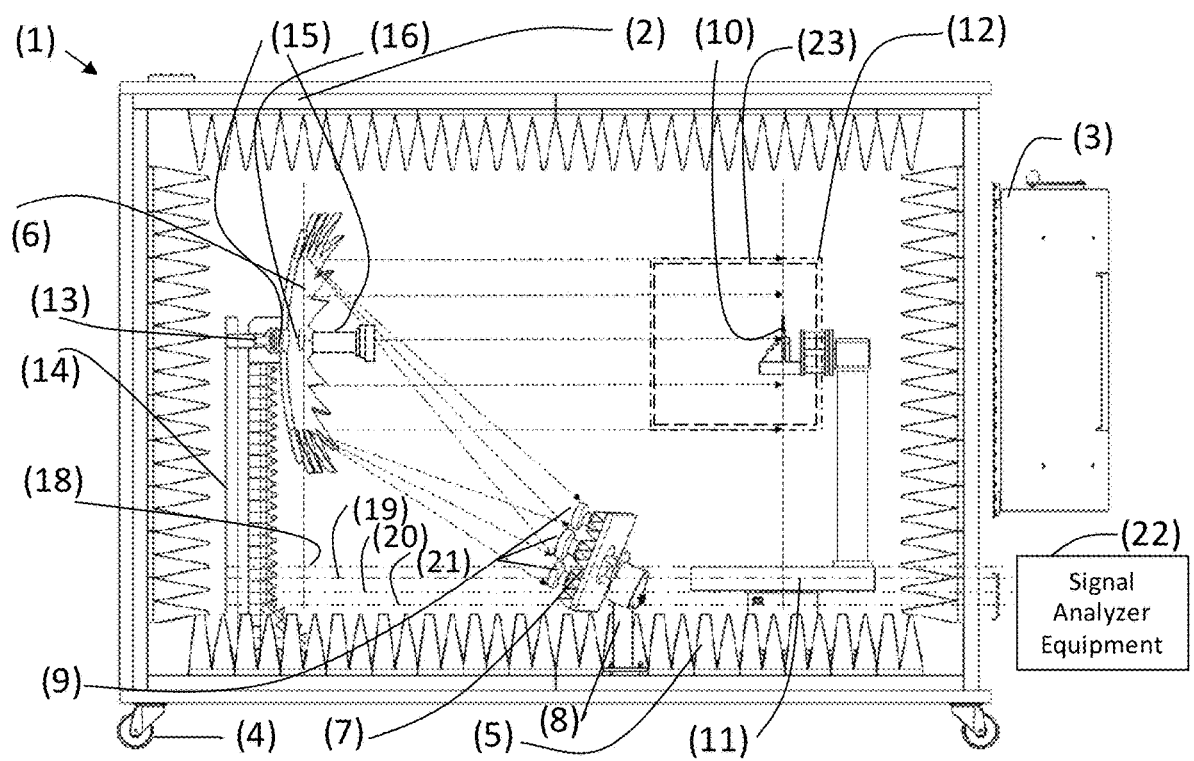
FIG. 1 is a cross sectional view of an exemplary hybrid compact, near-field-to-far-field and direct far-field test range that incorporates elements according to an embodiment of the present invention.
Figure 2:
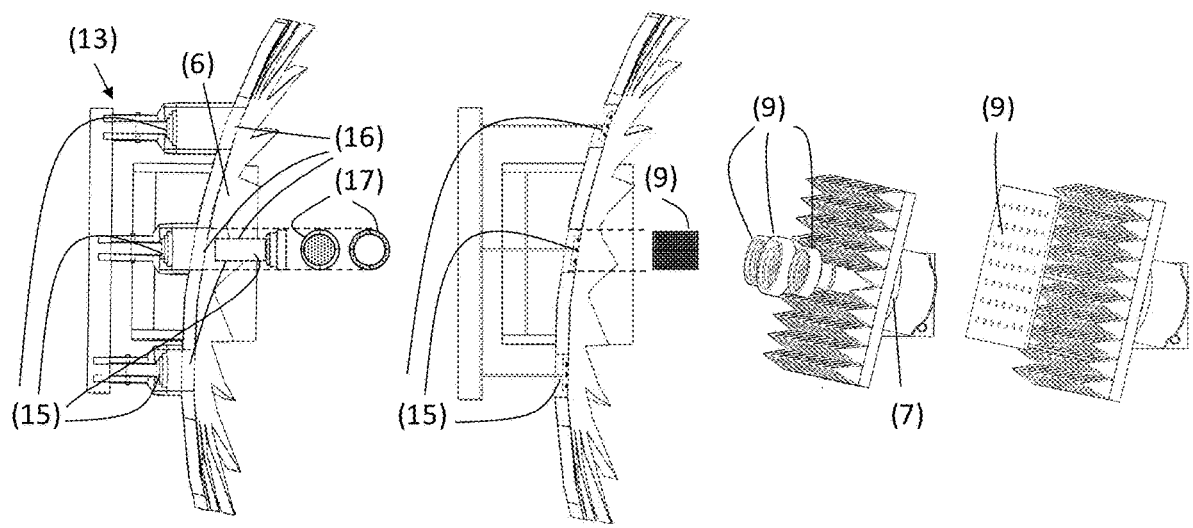
FIG. 2 is a horizontal cut through the center of the reflector which schematically illustrates an example embodiment in which the secondary feed source antenna set is located behind the curved reflector and with the aperture of three corrugated circular horn antenna elements (as an example) pierced to the reflector center or in front of it. In the example of FIG. 2, the circular metallic cap (17) at the circular secondary feed antenna aperture is also illustrated for either minimizing the effect on the reflector of the required excitation of EH or HE modes at the circular apertures being pierced to the reflector center.
Figure 3:
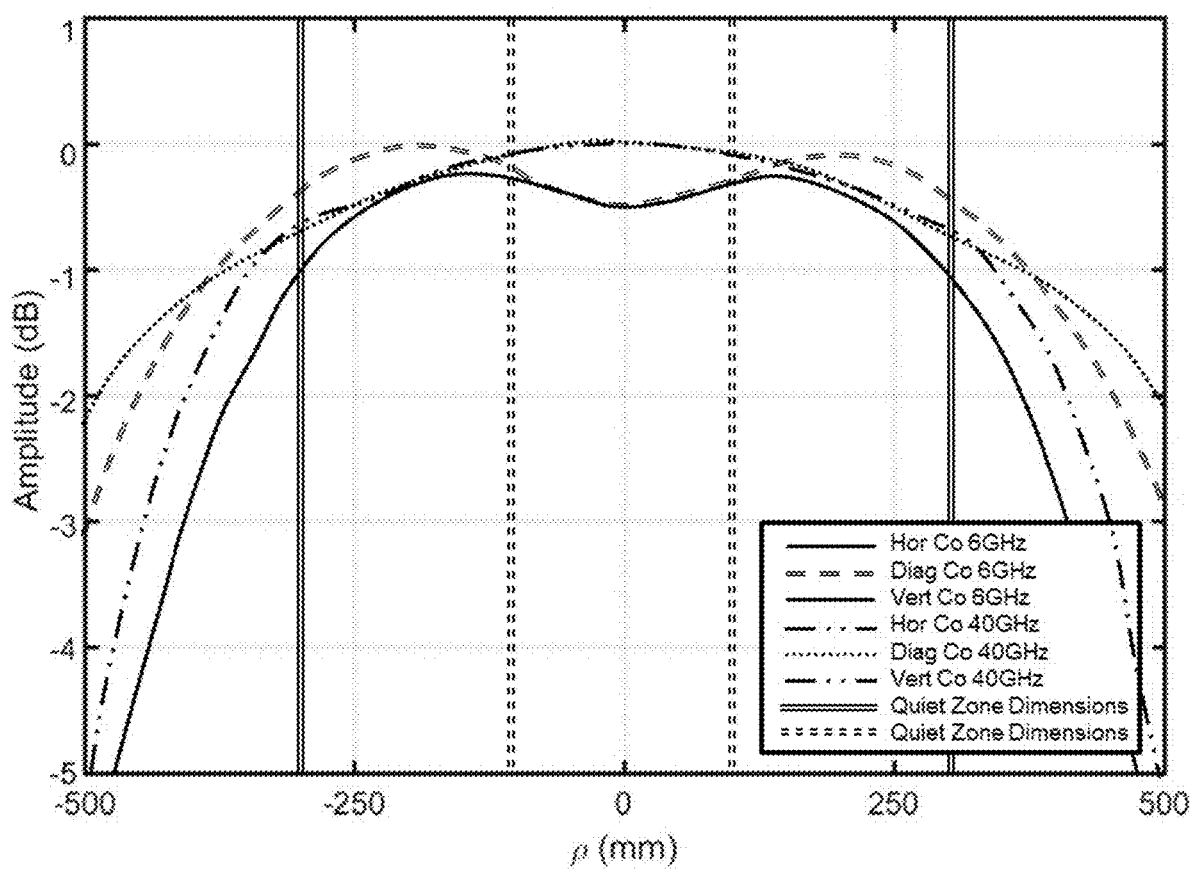
FIG. 3 illustrates two different wavefronts amplitude ripple at the quiet test zone, one from the primary feed source antenna set (CATR approach) at 40 GHz and another from the secondary feed source antenna set (DFF approach) at 6 GHz. ρ in FIG. 3 represents the distance from the quiet test zone center. Those skilled in the art can observe that the amplitude ripple within the quiet test zone for the present invention remains quite uniform, with amplitude non-uniformities always below 1 dB.
Figure 4:
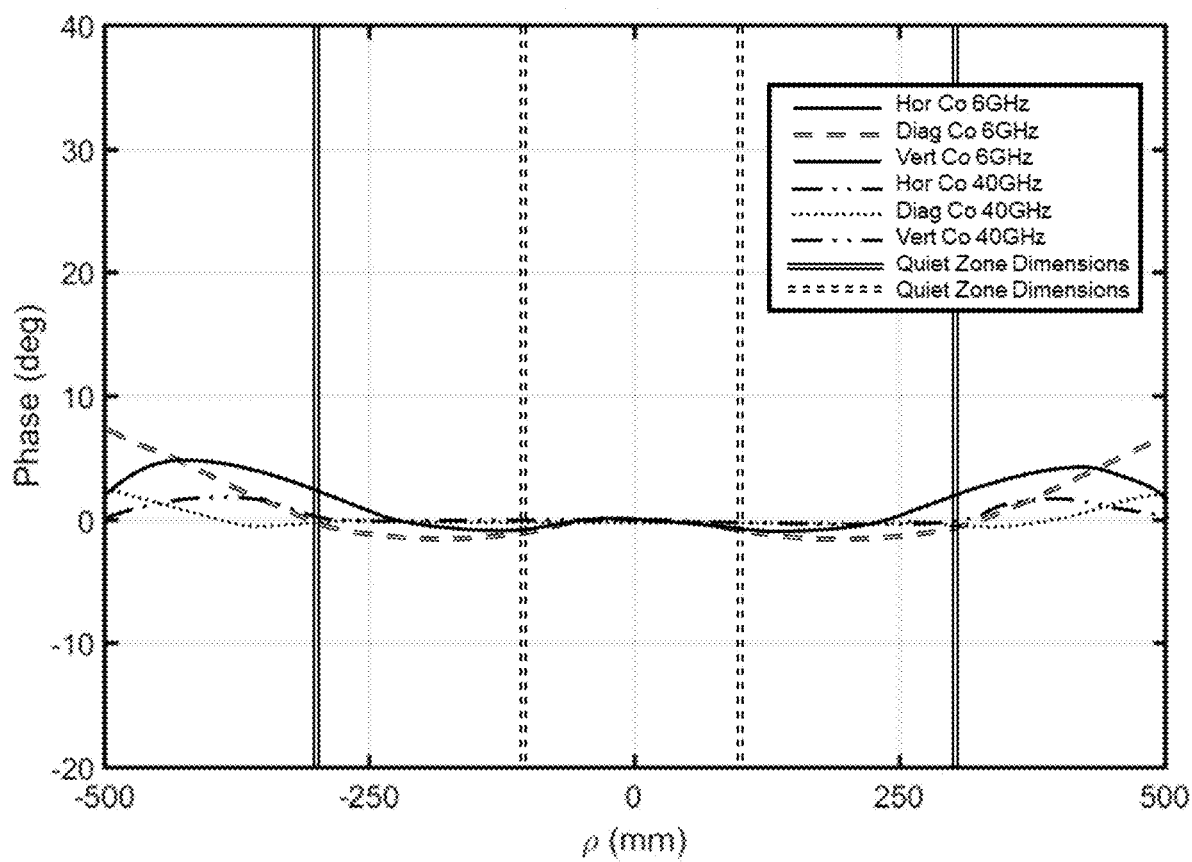
FIG. 4 illustrates the phase ripple analysis at the quiet test zone of the same wavefronts in FIG. 3. ρ in FIG. 4 represents the distance from the quiet test zone center. Those skilled in the art can observe that the phase ripple within the quiet test zone also remains quite uniform, with phase non-uniformities not only always below the 22.5° of the far-field boundary, but also within very good ±5° even with a 60 cm quiet test zone.

The following example help illustrating the present invention, but it must not be taken as restrictions of its capabilities.

Example 1. Hybrid Compact, Near-Field-to-Far-Field and Direct Far-Field Test Range where all Wavefronts are Planar In the favourite mode of the hybrid compact, near-field-to-far-field and direct far-field test range system the number of dual-polarized antenna elements at the primary feed source antenna set is one of the corrugated circular waveguide horn or printed array type, operating at the 5G FR2 mmWave frequency range, the number of antenna elements at the secondary feed source antenna set is one, of the type corrugated circular waveguide horn or printed array type, operating at the 5G Sub-6 GHz frequency range, the offset reflector has serrated edges with dimension of 1.2 m from tip to tip and the quiet test zone is a cylinder of 30 cm long by 30 cm in diameter, in which up to four different wavefronts in their far-field are provided. In this favourite mode of the hybrid compact, near-field-to-far-field and direct far-field test range system all wavefronts are in the far-field, and no near-to-far-field transformation is needed.

This hybrid compact, near-field-to-far-field and direct far-field test range system presents the following novelties:

The possibility of providing different uniform wavefronts at different frequency bands within a small anechoic chamber.

The possibility of providing different wavefronts at different frequency bands with different test approaches in a simultaneous manner, which blends the advantages of the approaches being use into a single system.

The possibility of testing AUT at many different frequency bands in a simultaneous manner.

The possibility of testing a DUT when the signal combines four different carriers. The hybrid compact, near-field-to-far-field and direct far-field test range system favourite mode has been designed to be used in the field of fifth generation wireless communications. This favourite mode allows for testing the over the air performance of a combination of FR1 and FR2 carriers in a simultaneous manner, providing a competitive advantage versus conventional single test approaches.

Example 2. Hybrid Compact, Near-Field-to-Far-Field and Direct Far-Field Test Range where not all Wavefronts are Planar In the favourite mode of the hybrid compact, near-field-to-far-field and direct far-field test range system the number of dual-polarized antenna elements at the primary feed source antenna set is three of the corrugated circular waveguide horn or printed array type, operating at the 5G FR2 mmWave frequency range, the number of antenna elements at the secondary feed source antenna set is one, of the type corrugated circular waveguide horn or printed array type, operating at the 5G Sub-6 GHz frequency range, the offset reflector has serrated edges with dimension of 1.5 m from tip to tip and the quiet test zone is a cylinder of 60 cm long by 60 cm in diameter, in which up to eight different wavefronts in either their far-field or near-field are provided. In this favourite mode of the hybrid compact, near-field-to-far-field and direct far-field test range system not all wavefronts are in the far-field, and consequently some near-to-far-field transformation is needed.

This hybrid compact, near-field-to-far-field and direct far-field test range system presents the following novelties:

The possibility of providing different uniform wavefronts at different frequency bands within a small anechoic chamber.

The possibility of providing different wavefronts at different frequency bands with different test approaches in a simultaneous manner, which blends the advantages of the approaches being use into a single system.

The possibility of providing near-field wavefronts to the quiet test zone, which can bring the advantage of testing high frequencies or large AUT or DUT using the same anechoic chamber size.

The hybrid compact, near-field-to-far-field and direct far-field test range system in this example 2 has been designed to be used in the field of fifth generation wireless communications when testing larger devices at high frequencies for FR1 and FR2 carrier combinations, for which the use of near-field wavefronts and the combination to other test approaches in a simultaneous manner is advantageous respect to conventional single test approaches.

The invention claimed is:

1. A hybrid compact, near- and far-field test range system (1) for providing several wavefronts at different frequency bands within a quiet test zone in which an antenna set of devices under test are placed, using three different test approaches (CATR, NFTF and DFF) in a simultaneous manner, and comprising:

An anechoic chamber (2) with a door (3), wheels (4) and absorbing material (5) covering the internal side of its walls, ceilings, door and floor, A curved reflector (6) with a lateral compact-antenna-test-range primary feed source antenna set (7) with one or several primary feed source antenna elements (9) of either the singe- or dual-polarized circular waveguide corrugated antenna horn type or the printed array type, and its CATR-primary-feed support tower (8), An antenna set under test (AUT) or devices under test DUT) (10) of either the gNodeB type or the User Equipment type, with its AUT/DUT tower and turntable support and positioning structure (11), located at a quiet test zone (12) and capable of providing roll, elevation and azimuth rotation, A direct far-field (DFF) and near-field-to-far-field (NFTF) secondary feed source antenna set (13), with its DFF/NFTF support tower (14) and with one or several primary feed source antenna elements (15) of either of the single- or dual-polarized circular waveguide corrugated antenna horn type or the printed array type, with their apertures pierced (16) at the center of the curved reflector and optionally caped (17) by metal pieces or placed in front of the reflector, A set of electric cables (18), Radiofrequency cables (19), Ethernet cables (20) and Fiber Optic cables (21), A signal analyzer equipment (22) located either inside or outside of the chamber.

2. The hybrid compact, near- and far-field test range system of claim 1 wherein the primary and secondary feed source antenna set elements include one or several high-gain single- or dual-polarized circular corrugated waveguide horns or printed arrays having a narrow radiation pattern.

3. The hybrid compact, near- and far-field test range system of claim 1 wherein absorbing material is placed on or around any support structure located inside the anechoic chamber in order to absorb any radiation not intended to contribute to the desired wavefronts.

4. The hybrid compact, near- and far-field test range system of claim 1 wherein rectangular waveguides are used instead of circular waveguides.

5. The hybrid compact, near- and far-field test range system of claim 1 wherein a climatic enclosure can be used within the quiet test zone in order to set different temperature and/or humidity conditions over the AUT or DUT.

6. The hybrid compact, near- and far-field test range system of claim 1 wherein signals sent on the wavefronts are intended to determine an antenna set under test radiation characteristics in terms of radiation patterns, beamwidths, axial ratios, front-to-back ratios, gain, directivity, correlation, capacity, diversity, spectral efficiency and radiation efficiency.

7. The hybrid compact, near- and far-field test range system of claim 1 wherein signals sent at the wavefronts are different carriers of cellular communication technologies, either fourth (4G), known as LTE, of fifth, known as 5G or NR, generation technologies, intended to determine the performance of AUT or DUT on beamforming, throughput, latency, transmit power or receiver sensitivity, used in those technologies, for schemes like single-carrier (SC), SISO, MIMO, multi-user MIMO (MU MIMO), massive MIMO (mMIMO), carrier aggregation (CA) or dual-connectivity (EN DC).

8. The hybrid compact, near- and far-field test range system of claim 1 wherein signals sent at the wavefronts are different carriers of LTE or 5G, intended to determine the performance of AUT or DUT for schemes like single-carrier (SC), SISO, MIMO, multi-user MIMO (MU MIMO), massive MIMO (mMIMO), carrier aggregation (CA) or dual-connectivity (EN DC) when in the presence of additional interference, noise or distortion being simultaneously present at some wavefronts.

9. The hybrid compact, near- and far-field test range system of claim 1 wherein signals sent at the wavefronts are different carriers of LTE or 5G, intended to determine the over the air performance of one or several simultaneous UE units with one or several simultaneous gNodeBs of gNodeB emulators.

10. The hybrid compact, near- and far-field test range system of claim 1 wherein signals sent at the wavefronts are different carriers of LTE or 5G, intended to determine the over the air performance of one or several simultaneous gNodeB units with one or several simultaneous UEs or UE emulators.

* * * * *